United States Patent
Hageman et al.

(10) Patent No.: US 9,093,984 B1
(45) Date of Patent: Jul. 28, 2015

(54) PHASE SHIFTER WITH TRUE TIME DELAY

(71) Applicants: Michael L. Hageman, Mount Vernon, IA (US); Russell D. Wyse, Center Point, IA (US)

(72) Inventors: Michael L. Hageman, Mount Vernon, IA (US); Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/030,557

(22) Filed: Sep. 18, 2013

(51) Int. Cl.
*H03H 11/16* (2006.01)
*H03H 11/20* (2006.01)

(52) U.S. Cl.
CPC ..................... *H03H 11/20* (2013.01)

(58) Field of Classification Search
None
See application file for complete search history.

(56) References Cited

U.S. PATENT DOCUMENTS

| | | | | |
|---|---|---|---|---|
| 5,712,592 A * | 1/1998 | Stimson et al. | ........... | 330/124 R |
| 5,796,307 A * | 8/1998 | Kumagai et al. | .............. | 330/149 |
| 7,196,578 B2 * | 3/2007 | Kermalli | ..................... | 330/124 R |
| 7,545,322 B2 * | 6/2009 | Newberg et al. | .............. | 342/372 |
| 7,656,964 B1 * | 2/2010 | DeCoste et al. | .............. | 375/297 |
| 8,195,118 B2 * | 6/2012 | Warnick | ..................... | 455/272 |
| 8,269,543 B2 * | 9/2012 | Teetzel | .......................... | 327/254 |
| 8,330,432 B2 * | 12/2012 | Van Zyl et al. | ................. | 322/36 |
| 8,749,306 B2 * | 6/2014 | Pengelly | .................. | 330/124 R |
| 2006/0139091 A1 * | 6/2006 | Fratti | ........................ | 330/124 R |
| 2006/0238245 A1 * | 10/2006 | Carichner et al. | ............ | 330/136 |
| 2010/0148877 A1 * | 6/2010 | Oakley et al. | ................. | 330/295 |
| 2012/0286899 A1 | 11/2012 | Lan et al. | | |
| 2013/0194017 A1 * | 8/2013 | Staudinger | ..................... | 327/231 |

OTHER PUBLICATIONS

U.S. Appl. No. 13/714,209, filed Dec. 13, 2012 "Ultra-Precision Linear Phase Shifter With Gain Control".

* cited by examiner

*Primary Examiner* — Cassandra Cox
(74) *Attorney, Agent, or Firm* — Angel N. Gerdzhikov; Donna P. Suchy; Daniel M. Barbieri

(57) ABSTRACT

A phase shifter includes a power splitter to split an RF signal into two separate signals. A true time delay (TTD) device is combined to the power splitter to receive one of the two separate signals and delay such signal in time to provide a time-delayed component signal. A first amplifier is combined to the power splitter to modify the other separate signal and a second amplifier is combined to the TTD device to modify the time-delayed component signal. A combiner is combined to both the first and the second amplifiers to combine the modified signal and the modified time-delayed component signal. The phase of the modified signal remains substantially the same with respect to the RF signal and the phase of the modified time-delayed component signal is ninety-degrees from the RF signal.

20 Claims, 3 Drawing Sheets

PHASE SHIFTER WITH TRUE TIME DELAY

BACKGROUND

The present disclosure relates generally to a phase shifter, and more specifically, to a wide-bandwidth phase shifter with a true time delay.

Phase shifters are used to change the transmission phase angle of a network. Ideal phase shifters provide low insertion loss, and equal amplitude (or loss) in all phase states. While the loss of a phase shifter is often overcome using an amplifier stage, the less loss, the less power that is needed to overcome it. Most phase shifters are reciprocal networks, meaning that they work effectively on signals passing in either direction.

An RF signal to the phase shifter is split into two signals that are ninety degrees apart, an in-phase (I) signal and a quadrature (Q) signal. The I signal and the Q signal can then be independently modified, with variable gain amplifiers, for example, and then these modified I and Q signals can be recombined to produce an output signal with a modified phase (and possibly gain) relative to the input signal. These devices work well in a narrow frequency range. What is needed, however, is a phase shifter that works well across a broad frequency range.

SUMMARY OF THE INVENTION

A phase shifter is disclosed. The phase shifter includes a power splitter to split an RF signal into two separate signals. A true time delay (TTD) device is combined to the power splitter to receive one of the two separate signals and delay such signal in time to provide a time-delayed component signal. A first amplifier is combined to the power splitter to modify the other separate signal, and a second amplifier is combined to the TTD device to modify the time-delayed component signal. A combiner is combined to both the first and the second amplifiers to combine the modified signal and the modified time-delayed component signal. The phase of the modified signal remains substantially the same with respect to the RF signal, and the phase of the modified time-delayed component signal is ninety-degrees from the RF signal.

In another embodiment, an electronically scanned array is disclosed. The electronically scanned array includes a plurality of elements each being adapted for transmitting or receiving signals. Each of the plurality of elements is combined to a phase shifter, as described above, to shift the phase of the signals for directing the signals transmitted from the plurality of elements or to phase shifting the signals received from the elements.

BRIEF DESCRIPTION OF THE DRAWINGS

The features and advantages of the present invention will be apparent by reference to the following detailed description of the illustrated embodiments when taken in conjunction with the following list of drawings, where like reference numerals refer to like elements.

DETAILED DESCRIPTION OF THE EMBODIMENTS

Figure 1A:
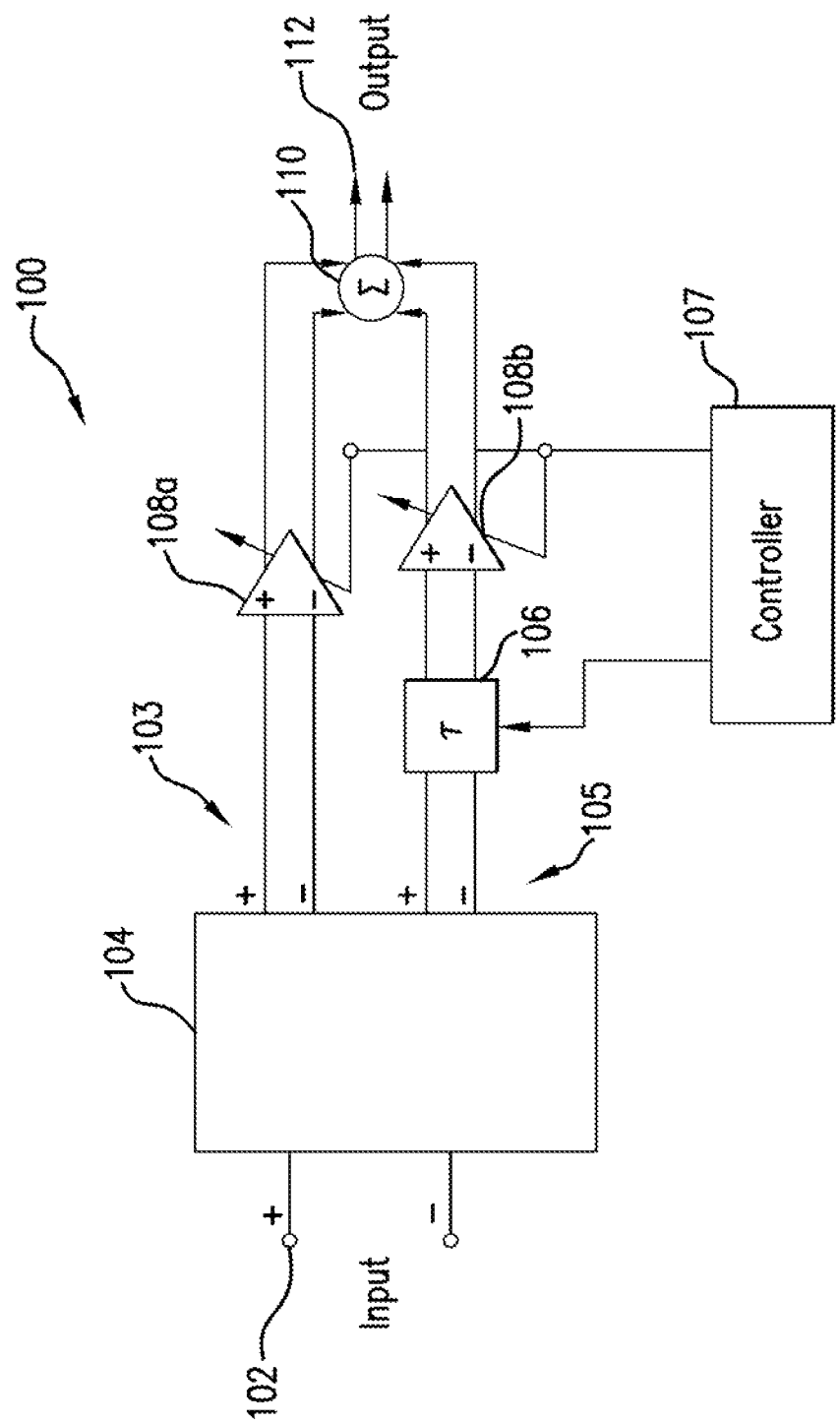
FIG. 1A is a schematic block diagram of a phase shifter, according to a first embodiment.

A true time delay (TTD) for a phase shifter 100 is disclosed. According to various embodiments, phase shifter 100 uses a vector modulation technique to shift the phase of an RF signal received at RF port 102. The RF signal is separated into two separate paths to form two separate signals. A ninety-degree phase shift is induced into one of the two separate paths to derive two component signals, an in-phase (I) signal and a quadrature-phase (Q) signal. The Q-signal corresponds to the out of phase components of the RF signals having a phase shift of ninety degrees from the I-signal. A phase shift of the RF signal is then realized by controlling the amplitude of the I-signal relative to the amplitude of the Q-signal; for example, elimination of the I-signal would result in a ninety (90) degree phase shift of the RF signal.

The RF signal received at RF port 102 is a differential RF input signal and is received at a power splitter 104. Power splitter 104 splits the differential RF input signal into two separate differential output paths 103 and 105. One output path 103 is for the I-signal and output path 105 is for the Q-signal. Power splitter 104 can be a passive power splitter or an active power splitter with buffer amplifiers, provided power splitter 104 can separate the differential RF output signal into two separate differential output paths 103 and 105 for modification of the differential RF input signal into its I and Q components (e.g., Iin+, Iin−, Qin+, and Qin−).

One of differential output paths 103 and 105 of power splitter 104 can use a true time delay (TTD) device 106 to add a 90 degree phase shift to the signal on that output path 103, 105 relative to the signal on the other output path 103, 105. In the illustrated embodiment of FIG. 1A, differential output path 105 includes TTD device 106 to shift the differential signal from power splitter 104 on output path 105 90-degrees relative to the differential signal from power splitter 104 on output path 103. This phase shift of the signal on output path 105 generates the Q-signal, which is 90 degrees out of phase with respect to the I-signal on differential output path 103.

Figure 1B:
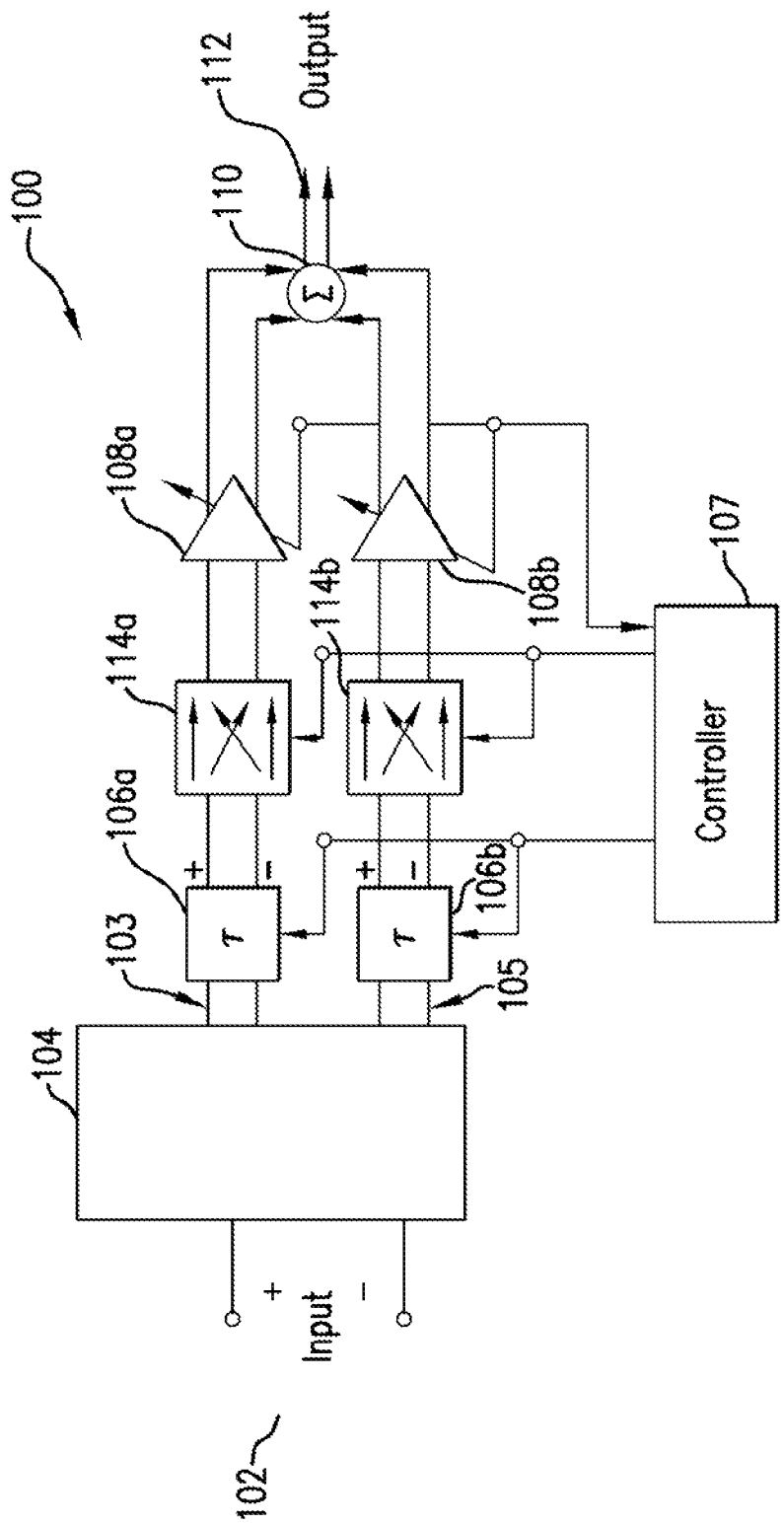
FIG. 1B is a schematic block diagram of a phase shifter, according to a second embodiment.

In an alternative embodiment shown in FIG. 1B, differential output path 103 includes a first TTD device 106a and differential output path 105 includes a second TTD device 106b. First TTD device 106a and second TTD device 106b phase shift the differential signals from power splitter 104 on each output path 103 and 105 relative to the differential RF input signal at RF port 102. One of first TTD device 106a and second TTD device 106b also phase shifts the differential signals from power splitter 104 ninety degrees relative to each other to generate the Q-signal. In FIG. 1B, the I-signal is found on path 103 and the Q-signal is found on path 105 after first and second TTD devices 106a, b, respectively.

TTD device 106 can be any device that delays an electrical signal for a defined period of time. TTD device 106 can be as simple as a delay line that takes an indirect path to amplifiers 108 compared to a direct path by the non-delayed component signal. This indirect path increases the time it takes for the composite signal to travel from power splitter 104 to amplifier 108 and creates a time-delayed component signal. TTD device 106 can also be a more sophisticated controllable time-delay unit controllable with a control signal from controller 107. Controller 107 can precisely tune the time delay provided by TTD device 106, so the time delay, and thus the phase shift, can be precisely tuned to compensate for design issues and/or manufacturing variances without the need to change component. For example, time delays and phase shifts from variances in the electrical pathways or traces between semiconductor batches can be compensated for by adjusting the time delay of TTD device 106 with controller 107. The I-signal and Q-signal can have their amplitude modified by amplifiers 108 to create a modified signal or a modified time-delayed component signal, respectively. Amplifiers 108a, b are configured to apply controllable amplification to the selected I and Q signal components, respectively. The amplified I and Q components (e.g., Io+, Io−, Oo+, and Oo−) are then recombined at combiner 110 to generate a phase shifted output signal from output 112. According to one embodiment, phase shifter may be an "ultra-precision linear phase shifter with gain control" Ser. No. 13/714,209, filed on Dec. 13, 2012 by the same inventors as the present application, the entirety of which is hereby incorporated by reference, with the component signal generator shown in block 404 in that application replaced with the herein disclosed power splitter 104 and TTD devices 106.

The gain of amplifiers 108 may be controlled with a control signal from controller 107 to determine the amount of phase shift applied to the RF signal received at RF port 102. In particular, the ratio of amplification by amplifier 108a (a first amplifier 108a) to the ratio of amplification by amplifier 108b (a second amplifier 108b) may be varied to control the phase shift of the differential RF input signal received at RF port 102. With the differential RF input signal shifted into orthogonal I and Q components by TTD device 106, increasing the I/Q amplification ratio via control of first amplifier 108a and second amplifier 108b with controller 107 can decrease the phase of the RF signal. In other words, the gains of first amplifier 108a and second amplifier 108b can be directly controlled such that the zero degree component of the RF signal (e.g., the I-signal) is emphasized and the ninety degree component (e.g., the Q-signal) is deemphasized in the RF output signal that results at output 112. Similarly, decreasing the I/Q amplification ratio via control of first amplifier 108a and second amplifier 108b may increase the phase of the RF signal.

FIG. 1B shows each differential output path 103 and 105 having TTD device 106 to provide a phase shift in each differential output path 103 and 105. Phase shifter 100 can be further modified to include sign selectors 114a and 114b in differential output paths 103 and 105, respectively. Sign selectors 114a and 114b operate by switching the signs of the I-signal, the Q-signal, or both, on the respective differential output paths 103 and 105. In this regard, the sign of the I-signal or the Q-signal can be reversed, i.e. providing a 180 degree phase shift, allowing for four-quadrant control over the differential RF input signal. The operation of sign selectors 114a and 114b is more fully described in application Ser. No. 13/14,209, supra, which is incorporated by reference.

Figure 2:
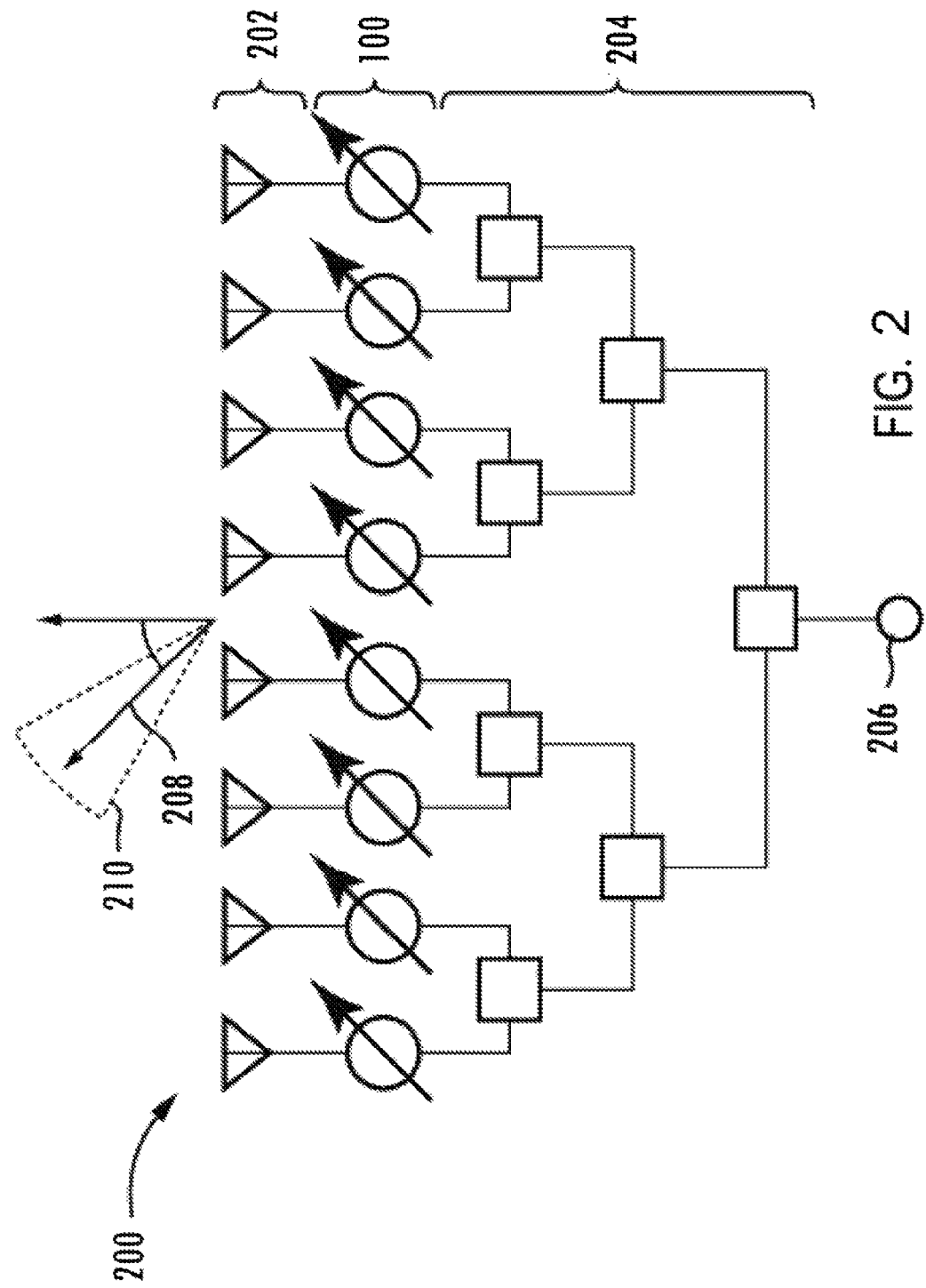
FIG. 2 is a schematic illustration of a row of phase shifters in an electronically scanned array.

Having described an exemplary embodiment of phase shifter 100 with true time delay, a particular application for such phase shifters 100 will now be described. FIG. 2 shows an electronically scanned array (ESA) 200 to control the direction of a radar's beam. ESA 200 is a useful component in broad-band RF communication systems where the energy in the signal is spread over many frequency ranges. ESA 200 includes a plurality of elements 202, which can include antennas, that function either to direct radio frequency waves away from ESA 200 or to receive radio frequency waves. Coupled to the array of elements 202 are a plurality of phase shifters 100.

Each element 202 may receive a signal from a signal source 206, which generates a radio frequency signal to be emitted from ESA 200 by elements 202. A power divider network 204 may divide the signal generated by signal source 206 and route the divided signals to elements 202.

The individual signals emitted by elements 202 may combine to form a beam 208 directed along a direction 210. Beam 208 may be emitted as a broadside beam orthogonal to ESA 200 (e.g., Θ=0) when the phase shift (ψ) produced by phase shifters 100 are also zero. To direct beam 208 at a different direction, such as along direction 210, phase shifters 100 may produce phase shifts as follows:

$$\phi_n = nkd^* \sin(\Theta)$$

where n is the nth element in the row of elements 202, $\phi$ is the phase excitation of the nth element in the row of elements 202, d is the distance between elements 202 in the row, Θ is the angle of beam 208 when directed along direction 210, and k is the wave number (e.g., $2\pi/\lambda$) of the emitted signal having a wavelength λ.

Knowing the desired phase shift for a given nth element 202, the time delay can be determined as follows:

$$\Delta t = \phi/(\omega)$$

where Δt is the desired time delay, $\phi$ is the phase shift, and ω is the angular frequency. With the desired time delay calculated, the circuit designer can tailor TTD devices 106 in each phase shifter 100 to achieve the appropriate time delay to obtain the desired phase shift.

Using a TTD device 106 to shift the phase in a phase shifter 100 with amplitude control has several advantages over prior art devices. TTD device 106 is physically smaller than prior art devices and operates with more bandwidth. This allows phase shifter 100 with TTD device 106 to be constructed on a single piece of semiconductor, i.e. "on-die." At high frequencies, i.e. above 2 GHz, the wavelength is 15 cm or smaller. This permits a physically small TTD device 106. In fact, moving to higher frequencies enables TTD device 106 to become even smaller. The time delay, and thus the phase shift, can be precisely tuned to compensate for design issues and/or manufacturing variations without the need to change components. Finally, initial testing has shown that TTD device 106 enables phase shifter 100 to achieve near 2-18 GHz of frequency operation with less than 3 dB gain variation, which is considerably better than prior devices. Additionally at extreme high frequencies, simulations have shown 3 dB bandwidths from 150-180 GHz are also possible. Extremely high frequencies are generally considered to be frequencies over 20 GHz due to the limitations of test equipment.

While the present invention has been particularly shown and described with reference to exemplary embodiments thereof, it should be understood by those of ordinary skill in the art that various changes, substitutions and alterations can be made herein without departing from the scope of the invention as defined by the appended claims and their equivalents.

What is claimed is:

1. A phase shifter comprising:
   an RF port configured for sending or receiving an RF signal;
   a power splitter combined to the RF port configured for splitting the RF signal into two separate signals;
   a true time delay (TTD) device combined to the power splitter configured for receiving one of the two separate signals and delaying in time the one of the two separate signals for providing a time-delayed component signal;
   a first amplifier combined to the power splitter and configured for receiving and amplifying one of the two separate signals with respect to the other separate signal and providing a modified signal;
   a second amplifier combined to the TTD device configured for receiving and modifying the time-delayed component signal and providing a modified time-delayed component signal;
   a controller combined to the first amplifier and the second amplifier, the controller configured for providing a first control signal to the first amplifier for controlling a gain of the first amplifier and for providing a second control signal to the second amplifier for controlling a gain of the second amplifier in order to emphasize or deemphasize a first phase component of the modified signal and a second phase component of the modified time-delayed component signal; and a combiner combined to the first amplifier and the second amplifier configured for combining the modified signal and the modified time-delayed component signal.

2. The phase shifter of claim 1, wherein the modified signal has an amplitude that is modified with respect to the RF signal.

3. The phase shifter of claim 2, wherein the modified signal has a phase that remains substantially the same with respect to the RF signal.

4. The phase shifter of claim 1, wherein the modified time-delayed component signal has an amplitude that is modified with respect to the RF signal.

5. The phase shifter of claim 4, wherein the modified time-delayed component signal has a phase that is ninety-degrees from the modified signal.

6. The phase shifter of claim 1, wherein the controller is configured to provide a control signal to the TTD device to control a time delay.

7. The phase shifter of claim 1, wherein the TTD device is constrained to a single piece of semiconductor with the phase shifter.

8. An electronically scanned array comprising:
a plurality of elements configured for transmitting or receiving signals;
a plurality of phase shifters each connected to one of the plurality of elements, the phase shifters configured for phase shifting the signals for directing the signals transmitted from the plurality of elements or to phase shifting the signals received from the plurality of elements, wherein each phase shifter further including:
an RF port configured for sending or receiving one of the signals;
a power splitter combined to the RF port configured for splitting the one of the signals into two separate signals:
a true time delay (TTD) device combined to the power splitter configured for receiving one of the two separate signals and delaying in time the one of the two separate signals and providing a time-delayed component signal;
a first amplifier combined to the power splitter configured for receiving and amplifying one of the two separate signals with respect to the other separate signal and providing a modified signal;
a second amplifier combined to the TTD device configured for receiving and modifying the time-delayed component signal and providing a modified time-delayed component signal;
a controller combined to the first amplifier and the second amplifier, the controller configured for providing a first control signal to the first amplifier for controlling a gain of the first amplifier and for providing a second control signal to the second amplifier for controlling a gain of the second amplifier in order to emphasize or deemphasize a first phase component of the modified signal and a second phase component of the modified time-delayed component signal; and
a combiner combined to the first amplifier and the second amplifier configured for combining the modified signal and the modified time-delayed component signal.

9. The electronically scanned array claim 8, wherein the modified signal has an amplitude that is modified with respect to the one of the signals.

10. The electronically scanned array claim 9, wherein the component signal has a phase that remains substantially the same with respect to the one of the signals.

11. The electronically scanned array claim 8, wherein the modified time-delayed component signal has an amplitude that is modified with respect to the one of the signals.

12. The electronically scanned array claim 11, wherein the modified time-delayed component signal has a phase that is ninety-degrees from the modified signal.

13. The electronically scanned array claim 12, wherein the controller is configured to provide a control signal to the TTD device to control a time delay.

14. The electronically scanned array claim 13, wherein the TTD device is constrained to a single piece of semiconductor with the phase shifter.

15. A phase shifter comprising:
an RF port configured for sending or receiving an RF signal;
a power splitter combined to the RF port configured for splitting the RF signal into two separate signals;
a true time delay (TTD) device combined to the power splitter configured for receiving one of the two separate signals and delaying in time the one of the two separate signals for providing a time-delayed component signal;
a first amplifier combined to the power splitter and configured for receiving and amplifying one of the two separate signals with respect to the other separate signal and providing a modified signal with a phase that is substantially the same with respect to the RF signal;
a second amplifier combined to the 110 device configured for receiving and modifying the time-delayed component signal and providing a modified time-delayed component signal with a phase that is substantially ninety-degrees from the modified signal;
a controller combined to the first amplifier and the second amplifier, the controller configured for providing a first control signal to the first amplifier for controlling a gain of the first amplifier and for providing a second control signal to the second amplifier for controlling a gain of the second amplifier in order to emphasize or deemphasize a first phase component of the modified signal and a second phase component of the modified time-delayed component signal; and
a combiner combined to the first amplifier and the second amplifier configured for combining the modified signal and the modified time-delayed component signal.

16. The phase shifter of claim 15, and further comprising a second TTD device combined to the power splitter configured for receiving an other one of the two separate signals and delaying in time the other one of the two separate signals.

17. The phase shifter of claim 16, wherein the other one of the two separate signals is out of phase with respect to the RF signal and ninety degrees from the modified time-delayed component signal.

18. The phase shifter of claim 17, wherein the modified signal has an amplitude that is modified with respect to the RF signal.

19. The phase shifter of claim 18, wherein the modified time-delayed component signal has an amplitude that is modified with respect to the RF signal.

20. The phase shifter of claim 15, wherein the controller is configured to provide a control signal to the TTD device to control a time delay.

\* \* \* \* \*